(12) United States Patent
Yoshimura et al.

(10) Patent No.: US 8,058,923 B2
(45) Date of Patent: Nov. 15, 2011

(54) CHARGE PUMP CIRCUIT AND SLICE LEVEL CONTROL CIRCUIT

(75) Inventors: Tsuyoshi Yoshimura, Gunma (JP); Taichiro Kawai, Kiryu (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 12/132,996

(22) Filed: Jun. 4, 2008

(65) Prior Publication Data

US 2008/0297232 A1    Dec. 4, 2008

(30) Foreign Application Priority Data

Jun. 4, 2007    (JP) ................. 2007-147845

(51) Int. Cl.
*G05F 1/10* (2006.01)
*G05F 3/02* (2006.01)
(52) U.S. Cl. ........... 327/537; 327/148; 327/157; 363/60
(58) Field of Classification Search ............ 327/52, 327/53, 58, 60, 62, 63, 65–69, 71, 72, 74, 327/77–81, 88, 89, 127, 246, 266, 274, 280, 327/287, 359, 560–563, 148, 157, 534–537; 363/59, 60
See application file for complete search history.

(56) References Cited

U.S. PATENT DOCUMENTS

| 5,473,283 | A | 12/1995 | Luich | |
|---|---|---|---|---|
| 6,218,900 | B1* | 4/2001 | Nolan | 330/255 |
| 6,407,619 | B1* | 6/2002 | Tanaka | 327/536 |
| 2005/0212597 | A1* | 9/2005 | Tsuchi | 330/253 |

FOREIGN PATENT DOCUMENTS

| JP | 9-237459 | 9/1997 |
|---|---|---|
| KR | 10-0292574 | 3/2001 |

* cited by examiner

*Primary Examiner* — Lincoln Donovan
*Assistant Examiner* — Brandon Cole
(74) *Attorney, Agent, or Firm* — Morrison & Foerster LLP

(57) ABSTRACT

The invention provides a charge pump circuit which reduces rise time of an output current even when an input signal is of high frequency. PMOS1 and PMOS2 have gates connected to each other, and the gate of the PMOS1 is connected to the drain thereof. A supply potential (Vdd) is applied to the sources of the PMOS1 and the PMOS2, and the PMOS1 and the PMOS2 form a current mirror circuit. First and second switching elements and a first constant-current source are connected to the drain of the PMOS2. A connection point (a node) of the first switching element and the second switching element is connected to an output terminal. The drain of the PMOS1 is connected to the first constant-current source through a third switching element, and connected to a second constant-current source through a fourth switching element.

8 Claims, 4 Drawing Sheets

FIG.2A First period

FIG.2B Second period

CHARGE PUMP CIRCUIT AND SLICE LEVEL CONTROL CIRCUIT

CROSS-REFERENCE OF THE INVENTION

This application claims priority from Japanese Patent Application No. 2007-147845, the content of which is incorporated herein by reference in its entirety.

BACKGROUND OF THE INVENTION

1. Field of the Invention

The invention relates to a charge pump circuit and a slice level control circuit suitably used for an optical disk reproducing device.

2. Description of the Related Art

Reproducing data recorded in an optical disk such as CD or DVD requires signal processing of converting an analog signal read by an optical pickup into a binary digital RF signal at a slice level control circuit (hereafter, referred to as an SLC circuit).

FIG. 5 is a circuit diagram showing a general SLC circuit. An analog RF signal read by an optical pickup is amplified by an RF amplifier (not shown) and inputted to an input terminal In. A capacitor 100 removes a direct-current component of the inputted analog RF signal, and the analog RF signal is supplied to one input terminal (an inverting input terminal) of a comparator 101. Vdd/2 (Vdd means a supply potential) is supplied to another terminal (a non-inverting input terminal) of the comparator 101 as a reference voltage. The comparator 101 compares the analog RF signal with the reference voltage and outputs a binary digital RF signal from an output terminal Out. In detail, the output of the comparator 101 is of a high level "1" when the analog RF signal is lower than the reference voltage, and the output of the comparator 101 is of a low level "0" when the analog RF signal is higher than the reference voltage. In the optical disk reproducing device, the digital RF signal is used as a reference clock of PLL (a phase locked loop).

One terminal (a positive terminal) of a capacitor 103 is connected between the capacitor 100 and the inverting input terminal of the comparator 101 through a resistor 102. Another terminal (a negative terminal) of the capacitor 103 is grounded.

A charge pump circuit 104 is further provided, which switches in response to the output level of the comparator 101 and flows a charging current 105 to the capacitor 103 and a discharging current 106 from the capacitor 103. In detail, when the output level of the comparator 101 is the high level, the charge pump circuit 104 charges the capacitor 103 by flowing the charging current 105 to the capacitor 103. When the output level of the comparator 101 is the low level, the charge pump circuit 104 discharges the capacitor 103 by flowing the discharging current 106 from the capacitor 103.

Such charging and discharging of the capacitor 103 adjust the level of the mean voltage of the analog RF signal, and the mean voltage of the analog RF signal serves as the slice level thereof. In the ideal case of no offset in the comparator 101, the slice level is equal to the reference voltage.

The relevant technology of the invention is described in Japanese Patent Application Publication No. hei 9-237459.

The duty ratio of the high level and the low level of the digital RF signal obtained from the SLC circuit is required to be 50% for reducing jitter. For achieving this, the current values (absolute values) of the charging current 105 and the discharging current 106 which are the output currents of the charge pump circuit need be equal to each other.

However, when the above described SLC circuit is operated by inputting the analog RF signal of high frequency (several MHz or more), in the conventional charge pump circuit the rise time of the output current becomes long to cause "distortion" as shown by A and B portions in FIG. 6 (In FIG. 6, the plus current of the current I corresponds to the charging current 105 and the minus current corresponds to the discharging current 106.).

This makes it difficult to provide equal current values to the charging current 105 and the discharging current 106, so that the duty ratio of the digital RF signal can hardly keep 50% to cause jitter in the waveform of the output signal of the SLC circuit.

SUMMARY OF THE INVENTION

The invention provides a charge pump circuit charging and discharging a capacitor in response to an input signal, including: a first current source; a second current source; a first transistor; a second transistor forming a current mirror circuit with the first transistor; and a switching circuit controlling itself so as to connect the first current source to the first transistor and output a charging current from the current mirror circuit to the capacitor when the input signal is of a first level, and connect the second current source to the first transistor, cut an output of the current mirror circuit and flow a discharging current from the capacitor by the first current source when the input signal is of a second level.

The invention also provides a slice level control circuit including: a first capacitor removing a direct-current component of an analog RF signal; a comparator comparing the analog RF signal inputted through the first capacitor and a reference voltage and outputting a digital RF signal in response to a comparison result, the analog RF signal being applied to a first input terminal and the reference voltage being applied to a second input terminal; a second capacitor connected to the first input terminal; and a charge pump circuit charging and discharging the second capacitor in response to the digital RF signal outputted from the comparator, the charge pump circuit comprising: a first current source; a second current source; a first transistor; a second transistor forming a current mirror circuit with the first transistor; and a switching circuit controlling itself so as to connect the first current source to the first transistor and output a charging current from the current mirror circuit to the second capacitor when the digital RF signal outputted from the comparator is of a first level, and connect the second current source to the first transistor, cut an output of the current mirror circuit and flow a discharging current from the second capacitor by the first current source when the digital RF signal outputted from the comparator is of a second level.

DETAILED DESCRIPTION OF THE INVENTION

Figure 1:
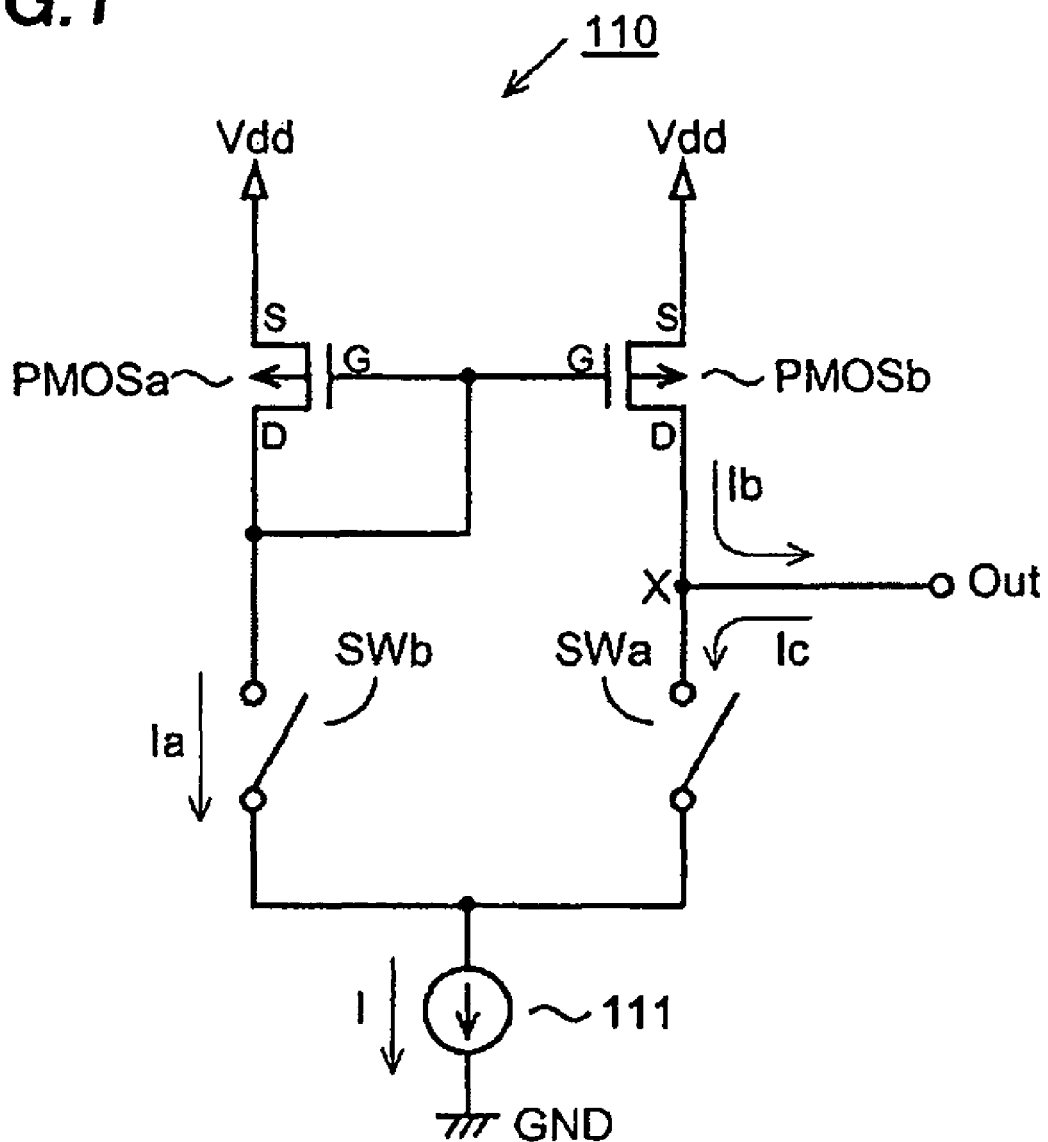
FIG. 1 is a circuit diagram showing a charge pump circuit of a reference example.

A reference example will be described referring to figures before a description of an embodiment of the invention. FIG. 1 is a circuit diagram showing a charge pump circuit 110 of the reference example.

This charge pump circuit 110 has P-channel type MOS transistors (hereafter, referred to as PMOSa and PMOSb), switching elements SWa and SWb, and a constant-current source 111 flowing a constant current I.

The gates of the PMOSa and the PMOSb are connected to each other, and the gate of the PMOSa is connected to the drain thereof. A supply potential (Vdd) is applied to the sources of the PMOSa and the PMOSb, and the PMOSa and the PMOSb form a current mirror circuit.

The constant-current source 111 is connected to the drain of the PMOSb through the switching element SWa, and a connection point (a node X) of the PMOSb and the switching element SWa is connected to an output terminal Out. The constant-current source 111 is connected to the drain of the PMOSa through the switching element SWb.

Figure 5:
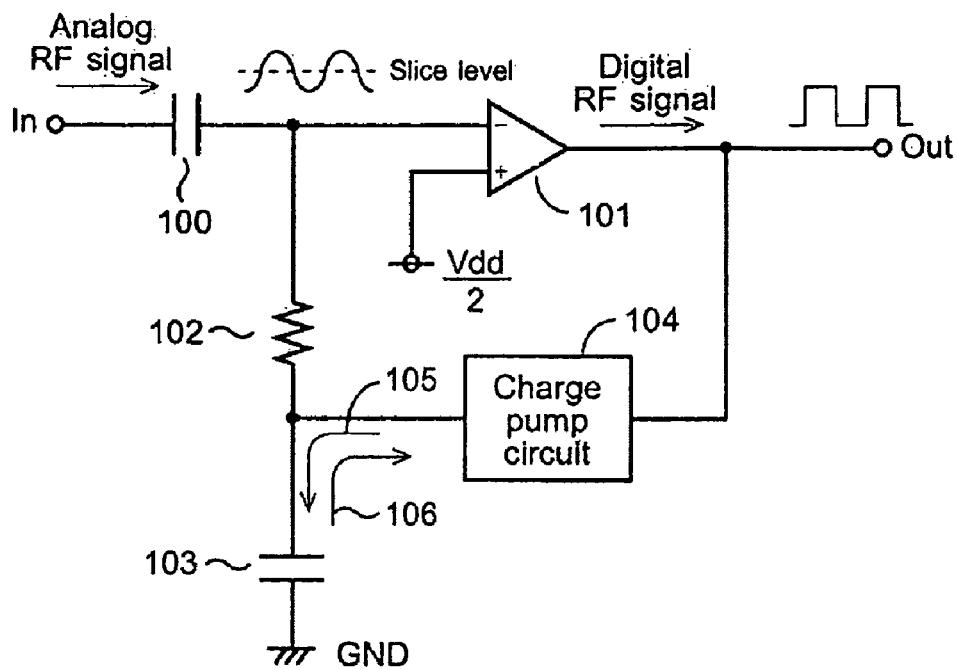
FIG. 5 is a circuit diagram showing a slice level control circuit.

Next, a description will be given about an operation of this charge pump circuit 110 when it is used for a charge pump circuit 104 of an SLC circuit shown in FIG. 5. When a digital RF signal outputted from a comparator 101 is of a high level, the switching element SWa turns off and the switching element SWb turns on. Then, the PMOSa turns on and a current Ia having a current value equal to that of the constant current I of the constant-current source 111 flows through the switching element SWb and the PMOSa. Then, due to the characteristics of the current mirror circuit, a charging current Ib (a charging current 105 shown in FIG. 5) having a current value equal to that of the current Ia is supplied to a positive terminal of a capacitor 103 through the output terminal Out.

Then, when the digital RF signal outputted from the comparator 101 changes from the high level to the low level, the switching element SWa turns on and the switching element SWb turns off. The PMOSa and the PMOSb then turn off and a discharging current Ic (a discharging current 106 shown in FIG. 5) having a current value equal to that of the constant current I of the constant-current source 111 flows from the capacitor 103 to the constant-current source 111 side through the output terminal Out.

Figure 6:
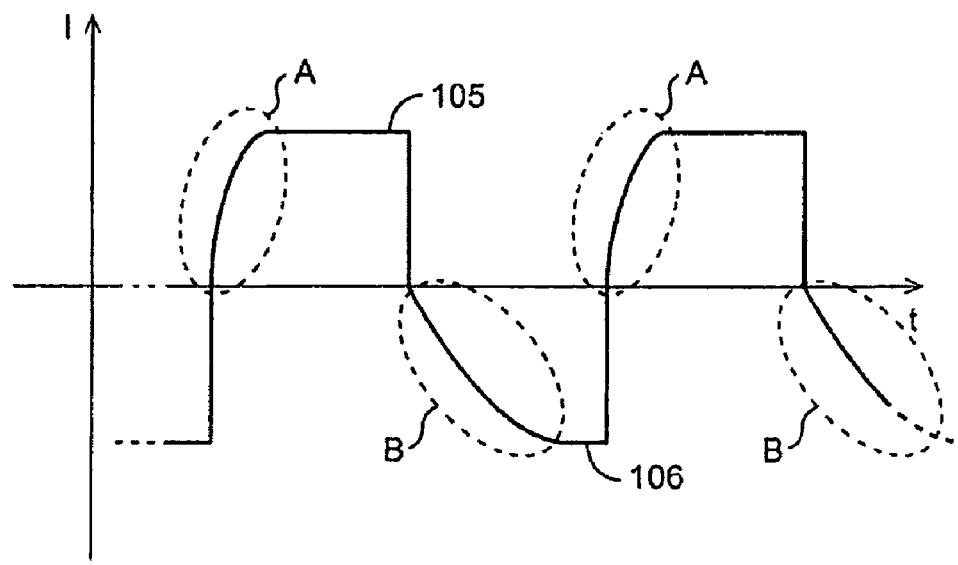
FIG. 6 is a waveform chart showing a problem to be solved by the invention.

When the SLC circuit is operated by inputting a high frequency analog RF signal, the rise time of the output current of the charge pump circuit 110 becomes long to cause "distortion" as shown by A and B portions in FIG. 6. The inventors found that the "distortion" in the A portions occurs due to switching delay of the PMOSa. In detail, the PMOSa keeps the off state during the flowing of the discharging current Ic, and even when the switching element SWa turns off and the SWb turns on thereafter, it takes much time for the PMOSa to change from the off state to the on state.

Furthermore, the cause of the "distortion" in the B portions is that the PMOSa and the PMOSb of the current mirror circuit keep the on state during the outputting of the charging current Ib, and even when the switching element SWa turns on and the SWb turns off thereafter, it takes much time for the PMOSb to turn off. In detail, the drain voltage of the PMOSa remains low (on state) immediately after the SWb turns off and the gate voltage of the PMOSb (=the drain voltage of the PMOSa) also keeps the on state voltage. Then, the drain voltage of the PMOSa gradually increases as a current flows from the supply potential Vdd to the PMOSa and accordingly the gate voltage of the PMOSb also increases, and eventually the PMOSb turns off.

Figure 2:
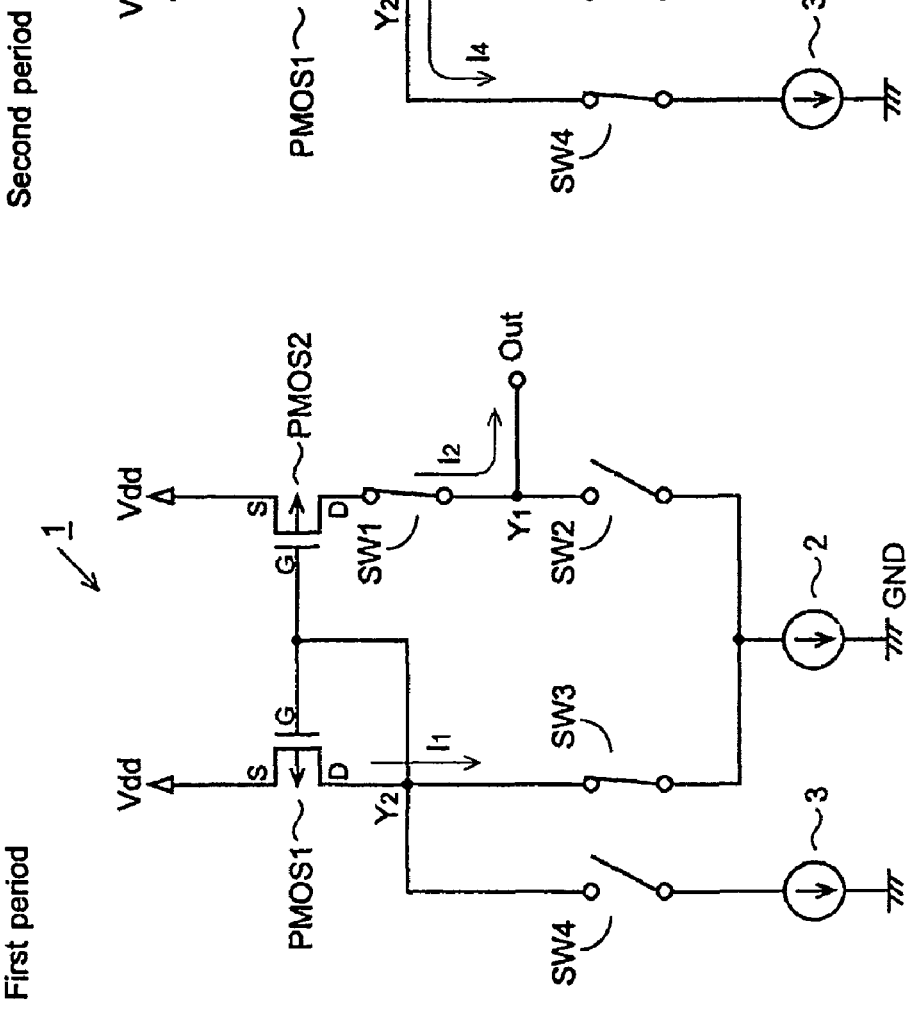
FIGS. 2 and 3 are circuit diagrams showing a charge pump circuit of an embodiment of the invention.

Next, an embodiment of the invention will be described referring to figures. FIGS. 2A and 2B are circuit diagrams showing a charge pump circuit 1 of an embodiment of the invention. This charge pump circuit 1 has first and second P-channel type MOS transistors (hereafter, referred to as PMOS1 and PMOS2), first to fourth switching elements SW1, SW2, SW3 and SW4, and first and second constant-current sources 2 and 3.

The gates of the PMOS1 and the PMOS2 are connected to each other, and the gate of the PMOS1 is connected to the drain thereof. A supply potential (Vdd) is applied to the sources of the PMOS1 and the PMOS2, and the PMOS1 and the PMOS2 form a current mirror circuit.

The first and second switching elements SW1 and SW2, and the first constant-current source 2 are connected to the drain of the PMOS2 in this order. A connection point (a node Y1) of the first switching element SW1 and the second switching element SW2 is connected to an output terminal Out.

The drain of the PMOS1 is connected to the first constant-current source 2 through the third switching element SW3, and connected to the second constant-current source 3 through the fourth switching element SW4. A connection point of the drain of the PMOS1, the third switching element SW3 and the fourth switching element SW4 is referred to as a node Y2.

Figure 3:
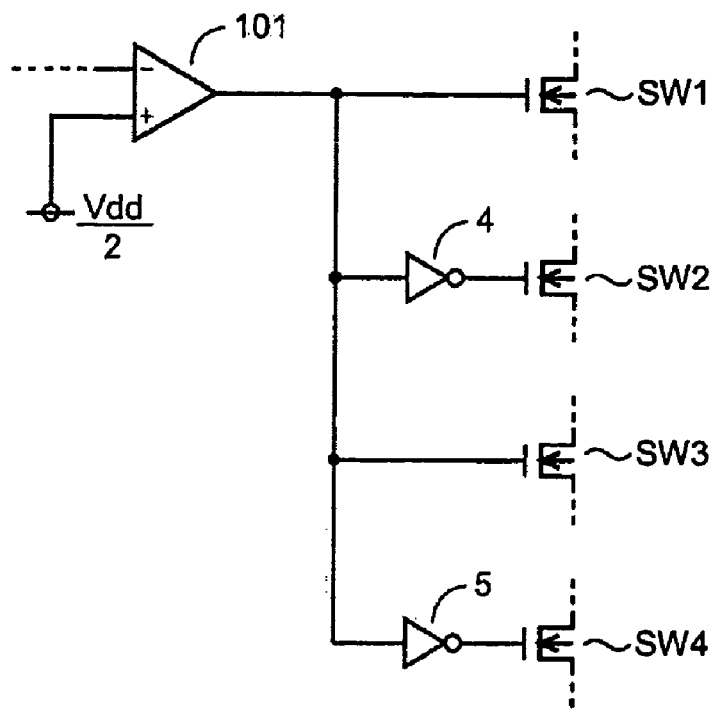

The charge pump circuit 1 is controlled with the digital RF signal outputted from the comparator 101 as shown in FIG. 3. In detail, when the first to fourth switching elements SW1 to SW4 are made of N-channel type MOS transistors, the output signal of the comparator 101 is applied to the gates of the first and third switching elements SW1 and SW3, and the digital RF signal is applied to the gates of the second and fourth switching elements SW2 and SW4 through inverters 4 and 5. By this, when the digital RF signal outputted from the comparator 101 is of the high level, the first and third switching elements SW1 and SW3 turn on and the second and fourth switching elements SW2 and SW4 turn off. When the digital RF signal outputted from the comparator 101 is of the low level, the first and third switching elements SW1 and SW3 turn off and the second and fourth switching elements SW2 and SW4 turn on.

In short, the charge pump circuit 1 is configured so that a current continuously flows through the PMOS1 by forming a dummy current path which does not affect the proper operation of the charge pump circuit 110 by providing the charge pump circuit 110 of the reference example with the fourth switching element SW4 and the second constant-current source 3. Furthermore, adding the first switching element SW1 removes "distortion" in the waveform of the output current, which is caused by switching delay of the PMOSa and the PMOSb such as in the reference example.

Next, a description will be given about an operation of this charge pump circuit 1 when it is used in the SLC circuit shown in FIG. 5. When the digital RF signal outputted from the comparator 101 is of the high level, the first and third switching elements SW1 and SW3 turn on and the second and fourth switching elements SW2 and SW4 turn off as shown in FIG. 2A. Hereafter, this period is referred to as a first period. Then, the PMOS1 turns on and a current I1 having a current value equal to that of the constant current of the first constant-current source 2 flows through the PMOS1 and the third switching element SW3. Then, due to the characteristics of the current mirror circuit, a charging current I2 (corresponding to the charging current 105 shown in FIG. 5) having a current value equal to that of this current I1 is supplied to the positive terminal of the capacitor 103 through the output terminal Out.

When the digital RF signal outputted from the comparator 101 changes from the high level to the low level, the first and third switching elements SW1 and SW3 turn off and the second and fourth switching elements SW2 and SW4 turn on as shown in FIG. 2B. Hereafter, this period is referred to as a second period. Since the second switching element SW2 turns on, a discharging current I3 (corresponding to the discharging current 106 shown in FIG. 5) equal to the constant current of the first constant-current source 2 flows from the capacitor 103 to the first constant-current source 2 side through the output terminal Out. Furthermore, since the drain of the PMOS1 is connected to the second constant-current source 3 through the fourth switching element SW4, the PMOS1 still keeps the on state even in the second period and a current I4 having a current value equal to that of the constant current of the second constant-current source 3 flows through the fourth switching element SW4. Furthermore, since the first switching element SW1 turns off, the output of the current mirror circuit is cut off immediately and a current does not flow from the PMOS2 to the output terminal Out.

Figure 4:
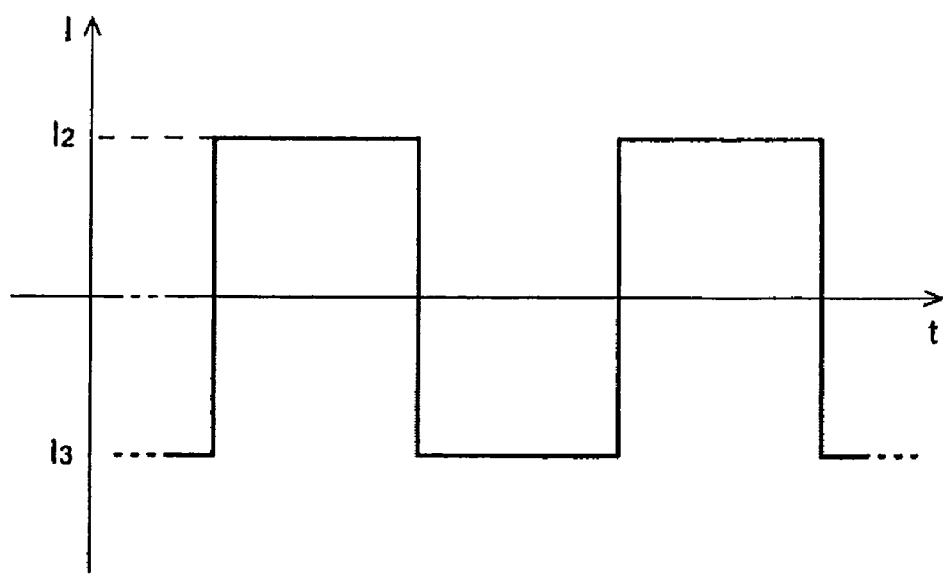
FIG. 4 is a waveform chart showing an output current of the charge pump circuit of the embodiment of the invention.

Accordingly, even when the SLC circuit is operated by inputting a high frequency analog RF signal, the rise time of the discharging current I3 is reduced to remove "distortion" in the waveform (see FIG. 4).

Furthermore, when the digital RF signal outputted from the comparator 101 changes from the low level to the high level (changes from the state in FIG. 2B to the state in FIG. 2A), it does not take time for the PMOS2 to turn on since a current keeps flowing through the PMOS1, unlike the case of the PMOSb in the charge pump circuit 110 of the reference example, thereby preventing rising delay of the charging current I2. Accordingly, even when the SLC circuit is operated by inputting a high frequency analog RF signal, the rise time of the charging current I2 is also reduced to remove "distortion" in the waveform (see FIG. 4). It is noted that the current value of the current I4 is preferably equal to the current value of the current I1, and thus the current values of the constant currents of the first second constant-current source 2 and the second constant-current source 3 are preferably equal to each other.

The structure of the embodiment provides a charge pump output of a desired duty ratio (e.g. 50%) by effectively preventing "distortion" in the waveform of the output currents (the charging current I2 and the discharging current I3) of the charge pump circuit 1. Therefore, using the charge pump circuit 1 in the SLC circuit realizes keeping the duty ratio of the digital RF signal 50% and reducing jitter in the signal waveform.

In the invention, modification is possible within the scope of the invention without limitation to the above embodiment. For example, while the charge pump circuit 1 is used as a part of the SLC circuit in the above embodiment, the charge pump circuit of the invention is widely applicable to a circuit charging and discharging a capacitor in response to a control signal.

The charge pump circuit of the invention reduces the rise time of the output current even when the input signal is of high frequency.

The slice level control circuit of this embodiment converts an analog RF signal into a digital RF signal, and keeps the duty ratio of the digital RF signal 50% and reduces jitter in the waveform of the output signal since the rise time of the output current of the charge pump circuit is reduced.

What is claimed is:

1. A charge pump circuit charging and discharging a capacitor in response to a digital input signal, comprising:
    a first current source and a second current source;
    a first transistor and a second transistor that form a current mirror circuit;
    an output terminal receiving an output of the second transistor as a charging current from the current mirror circuit; and
    a switching circuit configured to connect the first current source to the first transistor so as to output the charging current from the current mirror circuit to the capacitor when the digital input signal is at a first level and configured to connect the second current source to the first transistor, cut the output of the second transistor by disconnecting a connection between the second transistor and the output terminal and allow a discharging current from the capacitor to the first current source when the digital input signal is at a second level,
    wherein the switching circuit is configured so that the discharging current flows from the output terminal to a ground through the first current source when the digital input signal is at the second level, and
    wherein the charge pump circuit is configured to keep the first transistor and the second transistor in an on state when the digital input signal is at the first level and at the second level.

2. The charge pump circuit of claim 1, wherein the first and second current sources provide the same current.

3. The charge pump circuit of claim 1, wherein the first transistor comprises a MOS transistor, and the second transistor comprises a MOS transistor.

4. The charge pump circuit of claim 1, wherein the switching circuit comprises a first switching element connected between the second transistor and the output terminal of the charge pump circuit, a second switching element connected between the output terminal and the first current source, a third switching element connected between the first transistor and the first current source and a fourth switching element connected between the first transistor and the second current source.

5. A slice level control circuit comprising:
    a first capacitor receiving an analog RF signal so as to remove a direct-current component of the analog RF signal;
    a comparator comprising a first input terminal receiving the analog RF signal from the first capacitor, a second input terminal receiving a reference voltage and an output terminal outputting a digital RF signal;
    a second capacitor connected to the first input terminal; and
    a charge pump circuit charging and discharging the second capacitor in response to the digital RF signal outputted from the comparator, the charge pump circuit comprising a first current source, a second current source, a current mirror circuit comprising a first transistor and a second transistor, the output terminal receiving an output of the second transistor as a charging current from the current mirror circuit, and a switching circuit configured to connect the first current source to the first transistor so as to output the charging current from the current mirror circuit to the second capacitor when the digital RF signal is at a first level and configured to connect the second current source to the first transistor, cut the output of the second transistor by disconnecting a connection between the second transistor and the output terminal and allow a discharging current from the second capacitor to the first current source when the digital RF signal is at a second level, the discharging current flowing from the output terminal to a ground through the first current source when the digital RF signal is at the second level, wherein the charge pump circuit keeps the first transistor and the second transistor in an on state when the digital input signal is at the first level and at the second level.

6. The slice level control circuit of claim 5, wherein the first and second current sources provide the same current.

7. The slice level control circuit of claim 5, wherein the first transistor comprises a MOS transistor, and the second transistor comprises a MOS transistor.

8. The slice level control circuit of claim 5, wherein the switching circuit comprises a first switching element connected between the second transistor and the output terminal of the charge pump circuit, a second switching element connected between the output terminal and the first current source, a third switching element connected between the first transistor and the first current source and a fourth switching element connected between the first transistor and the second current source.

* * * * *